United States Patent

Calaway

[15] 3,688,213

[45] Aug. 29, 1972

[54] SIGNAL-CONTROLLED CONSTANT AMPLITUDE VARIABLE FREQUENCY MULTIVIBRATOR

[72] Inventor: Ward M. Calaway, Sierra Madre, Calif.

[73] Assignee: Burroughs Corporation, Detroit, Mich.

[22] Filed: Dec. 4, 1970

[21] Appl. No.: 95,077

[52] U.S. Cl. ..........................331/8, 331/25, 331/34, 331/113 R, 331/145, 331/177 R

[51] Int. Cl. ..........................H03b 3/04, H03k 3/282

[58] Field of Search......331/8, 18, 36, 25, 34, 113 R, 331/145, 172, 177 R; 332/14

[56] References Cited

UNITED STATES PATENTS 3,249,893 5/1966 Castellano, Jr. ...........331/113

3,253,237 5/1966 Runyan..................331/113 X 3,582,809 6/1971 Rigby ...........................331/8

*Primary Examiner*—Roy Lake

*Assistant Examiner*—Siegfried H. Grimm

*Attorney*—Christie, Parker & Hale

[57] ABSTRACT

A signal-controlled oscillator includes an astable multivibrator having a pair of alternately conducting switches and energy storage means that determines by the energy it stores which of the pair of switches is conducting. Each switch has an output terminal, at which the oscillator output signal is developed, and a control terminal coupled to the storage means. Means are provided for alternately applying an input control signal to the control terminals of the switches in regenerative phase depending upon which switch is conducting. The oscillator is synchronized in phase to a reference signal responsive to the output of the phase detector to which the reference signal and the oscillator output signal are applied.

18 Claims, 3 Drawing Figures

INVENTOR.
WARD M. CALAWAY
BY
Christie, Parker & Hale
ATTORNEYS

Patented Aug. 29, 1972 3,688,213

2 Sheets-Sheet 2

SIGNAL-CONTROLLED CONSTANT AMPLITUDE VARIABLE FREQUENCY MULTIVIBRATOR

CROSS-REFERENCE TO RELATED APPLICATIONS

This application is related to my two companion cases filed concurrently herewith and entitled "Phase Detector for Oscillator Synchronization", Ser. No. 95,079, filed Dec. 4, 1970 and "Phase Detector Initializer for Oscillator Synchronization", Ser. No. 95,206, filed Dec. 4, 1970, respectively.

BACKGROUND OF THE INVENTION

This invention relates to oscillators and, more specifically, to signal-controlled oscillators.

A common signal-controlled oscillator is a binary oscillator that generates a square-wave output signal the frequency of which is directly proportional to a signal level at the control terminal of the oscillator.

A typical binary oscillator is an astable multivibrator. One common astable multivibrator, which operates in a current mode is formed by a pair of transistors. The emitter electrodes of the transistors are coupled together by a timing capacitor charged by constant current sources connected to the respective emitters. The oscillator output signal is taken at the collector electrode of one of the transistors. The collector electrode of each transistor is cross-coupled to the base electrode of the other transistor, thereby providing a pair of regenerative feedback loops. The collector electrode of each transistor is generally clamped between maximum positive and negative voltage levels so as to establish a selected square-wave output. By varying the clamping voltage at the collector electrode of each transistor, the voltage level at the base electrodes is proportionately varied because of the cross-coupling. Since the amplitude of the timing waveform is proportional to the voltage level at the base electrodes, varying the voltage level at the base electrodes proportionately controls the period of oscillation.

A major disadvantage of the above type of oscillator control exists in that, although linear control over the period of oscillation is provided, the output amplitude is subject to excessive variation. In other words, varying the voltage level at which the output signal is clamped not only varies the base electrode voltage levels, but directly varies the amplitude of the output signal. Another disadvantage is that the clamping device introduces thermal drifts thus destroying the linearity between the control voltage and the periodic response. Specific temperature compensating circuitry must therefore be included to maintain a linear control over the period of oscillation.

SUMMARY OF THE INVENTION

The disadvantages inherent in signal-controlled oscillators of the type above described have been eliminated in the present invention wherein linear control over the period of oscillation is provided by controlling an input control signal, which is alternately applied to the bases of the transistors to sustain regeneration instead of the collector-to-base cross-coupling feedback connections. Therefore, since the collectors of the transistors are essentially not cross-connected to the bases during the timing intervals of the oscillator, the linear control does not appreciably affect the amplitude of the oscillator output signal, which remains constant over a wide range of period control. Furthermore, the oscillator of the present invention is inherently self-compensating for temperature variations.

Generally speaking, the oscillator of the present invention comprises an input control signal source and an astable multivibrator having a pair of alternately conducting switches and energy storage means that determines by the energy it stores which of the pair of switches is conducting. Each switch has an output terminal at which the oscillator output signal is generated and a control terminal coupled to the storage means. Means are provided for alternately applying the input control signal to the control terminals of the switches in regenerative phase depending upon which switch is conducting.

As used above, the term "regenerative phase" means that the input control signal is applied to the control terminal of that multivibrator switch which would control the charge across the storage device in a manner causing the multivibrator continuously to switch states. In a preferred embodiment, "regenerative phase" means that the input control signal is applied to the control terminal of the conducting switch so as to control the charge across the storage device in a manner that causes the cut-off switch to conduct and the conducting switch to cut-off. This process is then reversed and repeated periodically, thereby establishing the appropriate periodic output signal.

Since the control signal is from an external source coupled to the control terminals of the pair of multivibrator switches and essentially no cross-coupling exists from the output terminals to the control terminals during the timing intervals of the oscillator, the amplitude of the oscillator output signal at the output terminals remains essentially constant as the control signal varies. This is to be distinguished from the prior art arrangement where the period control came from the clamp at the output terminals of the switching elements, which were cross-coupled to the control terminals.

In a preferred embodiment, the oscillator operates in a current mode and its period of oscillation is a function of an input control current. The oscillator comprises a constant current source for supplying the input control current and a multivibrator having alternately conductive transistor switches. Each switch has an output collector terminal at which the oscillator output signal is generated and a control base terminal for receiving the input control current. Means respond to the signal levels at the output terminals of the multivibrator switches for supplying the input control current to only one switch during a controlled time interval to develop a signal level on the control terminal thereof and then, after the controlled time interval, for supplying the input control current only to the other switch for the same controlled time interval to develop a signal level on the control terminal thereof. This is repeated periodically thereby establishing a period of oscillation equal to the controlled time interval. Means are further included for establishing the controlled time interval responsive to the signal levels on the control terminals of the multivibrator switches; such means comprise constant current sources connected to the respective input emitter terminals of the switches and a capacitor for energy storage coupled between the input emitter terminals.

BRIEF DESCRIPTION OF THE DRAWINGS

These and other aspects and advantages of the present invention are more clearly described in the accompanying drawings, in which.

DESCRIPTION OF THE PREFERRED EMBODIMENT

Figure 1:
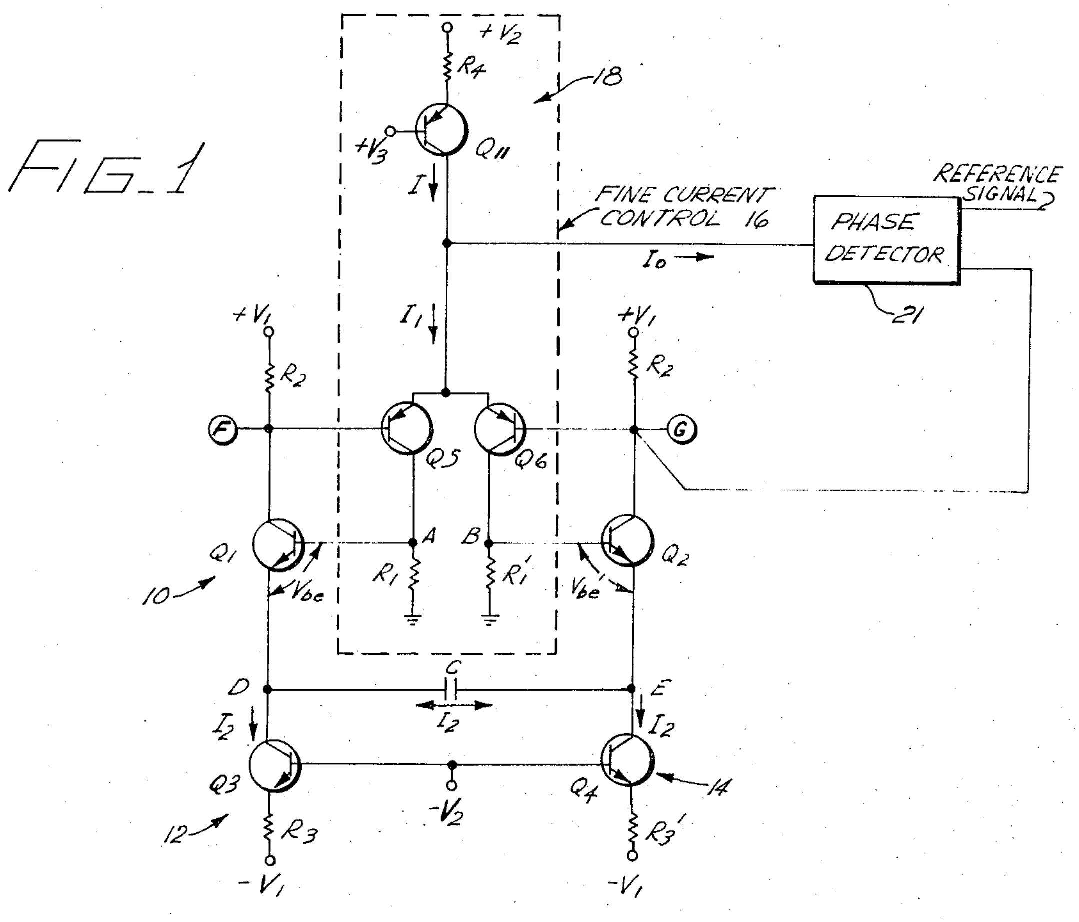
FIG. 1 is a schematic circuit diagram of an embodiment of the signal controlled oscillator of the present invention.

A current-controlled oscillator 10 in accordance with the teachings of the present invention is shown in FIG. 1. Oscillator 10 is comprised of a pair of switches, such as transistors $Q_1$ and $Q_2$, having their input terminals (emitter electrodes) coupled together by a charge/discharge or energy storage device, such as timing capacitor C. As will be seen, transistors $Q_1$ and $Q_2$ are connected to alternately conduct as an astable multivibrator, the period of oscillation of which is determined, in part, by a timing current $I_2$, through capacitor C. For purposes of example, it is a given condition of oscillator 10 that such timing current remain constant. Thus, a terminal D of capacitor C is coupled to a constant current source 12 that supplies a constant current $I_2$ in the direction of current flow through transistor $Q_1$. Correspondingly, a terminal E of capacitor C is coupled to a constant current source 14 that supplies a constant current $I_2$ in the direction of current flow through transistor $Q_2$. Thus, current sources 12 and 14 generate the same current $I_2$. Current sources 12 and 14 additionally provide an emitter current of $2I_2$ for transistors $Q_1$ and $Q_2$ when they are alternately conducting and establish the amplitude of the oscillator output signal as will be more fully described below.

Constant current source 12 includes a transistor $Q_3$ having its emitter electrode coupled to a negative supply voltage $-V_1$, through a resistor $R_3$, its collector electrode coupled to capacitor terminal D, and its base electrode coupled to another smaller negative supply voltage $-V_2$. Source 14 includes a transistor $Q_4$ essentially matched to transistor $Q_3$. The emitter electrode of transistor $Q_4$ is connected to negative voltage source $-V_1$ through a resistor $R_3'$ equal to resistor $R_3$. The base electrode of transistor $Q_4$ is coupled to negative voltage source $-V_2$ and its collector electrode is coupled to terminal E of capacitor C. The output signal from oscillator 10 is essentially square/wave and is developed at either the output terminal F (collector electrode of transistor $Q_1$) or the output terminal G (collector electrode of transistor $Q_2$). Points F and G are coupled respectively to a positive supply voltage $+V_1$ through equal resistors $R_2$ and $R_2'$. As will be described more fully below, when transistor $Q_1$ is conducting and transistor $Q_2$ is cut off, the voltage level at point F is $V_1-2I_2R_2$ and the voltage level at point G is $V_1$. The converse is true when transistor $Q_1$ is cut off and transistor $Q_2$ is conducting.

A fine current control 16 is used to control the voltage level at the base electrodes of transistors $Q_1$ and $Q_2$, thereby controlling the charging and discharging time of capacitor C and thus the period of oscillation. This is explained in greater depth below with reference to FIG. 3. Fine current control 16 comprises a pair of differentially connected switching transistors $Q_5$ and $Q_6$ of opposite conductivity type from transistors $Q_1$ and $Q_2$. The emitter electrodes of transistors $Q_5$ and $Q_6$ are connected together and to a constant current source 18, which generates a constant bias current I. Source 18 includes a resistor $R_4$ coupling a positive voltage source $+V_2$ to the emitter electrode of a transistor $Q_{11}$, the collector electrode of which is coupled to the emitter electrodes of transistors $Q_5$ and $Q_6$, and the base electrode of which is coupled to a smaller positive supply voltage $+V_3$. An adjustable current $I_1$ is supplied to the emitter electrodes of transistors $Q_5$ and $Q_6$. The value of current $I_1$ is controlled by the amplitude of a draining current $I_o$ which is applied by a constant current source, namely a phase detector 21. The oscillator output signal appearing at the collector electrode of transistor $Q_2$ and a reference signal are applied to the inputs of phase detector 21, which produces a current, $I_o$, proportional to the phase difference. As a result, oscillator 10 becomes synchronized to the reference signal.

Current $I_1$, being equal to current I minus current $I_o$, is thus proportional in amplitude and opposite in polarity to current $I_o$. In other words, as current $I_o$ is decreased, current $I_1$ is increased. Although current $I_1$ is thus adjustable, it is still constant once adjusted, since currents I and $I_o$ are from constant current sources.

In this specification, the term "constant current source" is used in its conventional sense to mean a source of current having a very high source impedance, so changes in the load impedance fed by the source do not appreciably affect the amplitude of the current supplied by the source.

The collector electrode of transistor $Q_5$ is coupled to a control terminal A (base electrode) of transistor $Q_1$ which is in turn coupled to ground through a resistor $R_1$. Correspondingly, the collector electrode of transistor $Q_6$ is coupled to a control terminal B (base electrode) of transistor $Q_2$ which is in turn coupled to ground through a resistor $R_1'$ equal to resistor $R_1$. Transistors $Q_5$ and $Q_6$ essentially form a gate, which alternately directs current $_1$ through transistor $Q_5$ and resistor $R_1$ to ground if the voltage level at point F is more negative than the voltage level at point G, and directs current $I_1$ through transistor $Q_6$ and resistor $R_1'$ to ground if the voltage level at point G is more negative than the voltage level at point F.

The manner of achieving linear control over the period of oscillation of oscillator 10 by controlling the current $I_1$, as well as maintaining a constant output amplitude of $+V_1$ high and $V_1-2I_2R_2$ low over a wide range of frequencies is now explained with reference to FIGS. 1 and 3.

Starting at time $t_1$ (FIG. 3), transistor $Q_1$ has just become conducting and transistor $Q_2$ has just cut off. Since transistor $Q_1$ is conducting, a current flows therethrough from its collector to emitter. The value of this current is $2I_2$. In this case, current $I_2$ is flowing from terminal D, at a voltage $I_1R_1-V_{be}$, where $V_{be}$ is the base-emitter drop across transistor $Q_1$ when it is conducting, to terminal E at a voltage $2I_1R_1-V'_{be}$($V'_{be}$ being the base-emitter drop across transistor $Q_2$ when it is conducting). How the voltage levels at terminals D and E are arrived at is explained below.

Since current $I_2$ is flowing into source 12 from point D and into source 14 through capacitor C from point D and since the current through transistor $Q_1$ is $2I_2$, the voltage level at output F is $+V_1-2I_2R_2$. Since transistor $Q_2$ is cut off, zero current is flowing therethrough and thus the voltage level at output G is $+V_1$. Point F is more negative than point G so current $I_1$ flows through transistor $Q_5$ from its emitter to its collector (the emitter-base current is between 1 percent and 5 percent of $I_1$ and may thus be considered insignificant). Thus, the voltage at point A is $I_1R_1$, thereby maintaining transistor $Q_1$ conducting, since point D is at $I_1R_1-V_{be}$. Since no current flows through transistor $Q_6$, the voltage at point B is zero thereby maintaining transistor $Q_2$ off because point E is at $2I_1R_1-V'_{be}$.

Proceeding from time $t_1$ to time $t_2$, transistor $Q_1$ cuts off and transistor $Q_2$ begins to conduct. As current $I_2$ flows through capacitor C from terminal D to E, the voltage level at terminal E begins to drop from $2I_1R_1-V_{be}$ to $-V_{be}$, such indicating that the capacitor is fully charged to a value of $I_1R_1$, i.e. the voltage level at point D minus that at point E $[I_1R_1-V_{be}-(-V_{be})]$, see FIG. 3.

When point E reaches $-V_{be}$, it is more negative than point B, which is at zero volts. Transistor $Q_2$ thereby begins to conduct, bringing the voltage at G down to $+V_1-2I_2R_2'$ from $+V_1$. This causes current $I_1$ to flow through transistor $Q_6$, bringing point B up to a voltage of $I_1R'_1$ from zero and dropping point A to zero. Thus, transistor $Q_1$ cuts off and the voltage at point F rises from $+V_1-2I_2R_2$ to $+V_1$. This process is periodically repeated.

In summary, fine current control 16 effectively constitutes a means for alternately applying current $I_1$ to the base electrodes of multivibrator switching transistors $Q_1$ and $Q_2$ in regenerative phase, depending upon which of these transistors is presently conducting. The term "regenerative phase" means that the input control current $I_1$ is always applied to the base electrode of the one of transistors $Q_1$ and $Q_2$ which will cause capacitor C to charge toward a condition that changes the state of transistors $Q_1$ and $Q_2$. Thus, transistors $Q_1$ and $Q_2$ alternately conduct and cut off in free running fashion. As applied to the particular circuit of FIG. 1, regenerative phase means that when transistor $Q_5$ is conducting, current $I_1$ is coupled by transistor $Q_5$ to the base electrode of transistor $Q_1$ to charge capacitor C with current $I_2$ until transistor $Q_2$ begins to conduct; and when transistor $Q_2$ is conducting, current $I_1$ is coupled by transistor $Q_6$ to the base electrode of transistor $Q_2$ to charge capacitor C with current $I_2$ in the opposite direction until transistor $Q_1$ begins to conduct. In contrast, if current $I_1$ were coupled to the base of the cut off transistor instead of the conducting transistor, current $I_1$ would be coupled in degenerative phase with the result that the circuit would not run freely.

The time it takes for the capacitor to charge up to $+I_1R$ or to discharge to $-I_1R_1$ is represented by $\Delta t$ where $\Delta t = t_2 - t_1$. It is known that $\Delta t = C \Delta V/I$, where $\Delta V = +I_1R_1-(-I_1R_1) = 2I_1R_1$, and $I = I_2$. Thus $\Delta t = 2R_1C\, I_1/I_2$ or $\Delta t\ \alpha I_1/I_2$. In other words, the period of oscillation, $\tau$, where $\tau = 2\Delta t$, is proportional to the adjustable current $I_1$ from constant current source 18 and is inversely proportional to the current $I_2$ generated by constant current sources 12 and 14.

Assume that current $I_1$ is raised. This raises the change in voltage necessary across capacitor $C$ for the transistors to switch states. At time $t_1$, the charge across capacitor $C$ is $-I_1R_1$. Capacitor C has to charge $+2I_1R_1$ volts to a level of $+I_1R_1$ before switching occurs at time $t_2$. By increasing $I_1$, it will take longer for capacitor C to reach voltage level $+I_1R_1$ since the charging current $I_2$ is always constant. Thus, an increase in current $I_1$ increases the period of oscillation. Correspondingly, a decrease in current $I_1$ decreases the period of oscillation.

An important feature of the present invention is the ability to provide linear control over the period of oscillation and yet provide a constant output amplitude over a wide range of frequencies. This is clearly seen with reference to FIG. 3 where the voltage levels at points F and G (the oscillator outputs) vary between a high level of $+V_1$ and a low level of $+V_1-I_2R_2$ (point F) or between $+V_1-I_2R_2'$ and $V_1$ (point G). It is thus apparent that these will remain unchanged as current $I_1$ changes to vary the period of oscillation since $I_1$ forms no part of the above output voltage expressions.

Since $\tau \alpha\ I_1/I_2$, it is obvious that the period could alternatively be varied by adjusting the timing current $I_2$. An increase in current $I_2$ decreases the period because it takes a shorter time for the capacitor to charge or discharge. Assume that current $I_1$ is held constant and current $I_2$ is made variable. Current $I_2$ could be made variable by varying voltage $-V_2$, for example. If nothing were added to the circuit of FIG. 1, a change in $I_2$ would affect the amplitude of the oscillator output waveform at points F and G since current $I_2$ is found in the output voltage expressions. This is undesirable. However, to control the period of oscillation by varying current $I_2$ without affecting the oscillator output amplitude, an isolation gate circuit such as shown in FIG. 2 could be added to oscillator 10.

Figure 2:
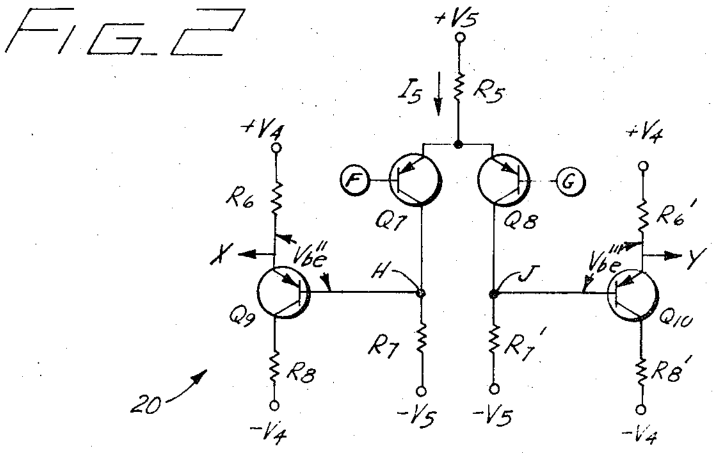
FIG. 2 is a schematic circuit diagram of an isolation gate which may be used with the oscillator of FIG. 1.

Specifically, in FIG. 2 gate 20 operates to isolate changes in current $I_2$ from affecting the oscillator output amplitude, as the gate comprising transistors $Q_5$ and $Q_6$ do for changes in control current $I_1$. Gate 20 includes a pair of transistors $Q_7$ and $Q_8$ having interconnected emitter electrodes which are in turn coupled to a positive voltage source $+V_5$ through a resistor $R_5$. The base electrode of transistor $Q_7$ is coupled to point F of oscillator 10 and the base electrode of transistor $Q_8$ is coupled to point G of oscillator 10. The collector electrode of transistor $Q_7$ is coupled to the base electrode of a transistor $Q_9$ and to a negative voltage source $-V_5$ through a resistor $R_7$. Similarly, the collector electrode of transistor $Q_8$ is coupled to the base electrode of a transistor $Q_{10}$ and to negative voltage source $-V_5$ through a resistor $R_7'$ equal to resistor $R_7$.

The collector electrode of transistor $Q_9$ is coupled to a negative voltage source $-V_4$ through a resistor $R_8$ and the emitter electrode of transistor $Q_9$, which forms a new oscillator output X, is coupled to a positive voltage source $+V_4$ through a resistor $R_6$. Similarly, the collector electrode of transistor $Q_{10}$ is coupled to negative voltage source $-V_4$ through a resistor $R_8'$ equal to resistor $R_8$. The emitter electrode of transistor $Q_{10}$ forms another new output Y of oscillator 10 and is coupled to positive voltage source $+V_4$ through a resistor $R_6'$ equal to resistor $R_6$.

Transistors $Q_7$ and $Q_8$ function in the same manner as transistors $Q_5$ and $Q_6$, switching current $I_5$ alternately to the base of transistors $Q_9$ and $Q_{10}$ depending upon whether point F is more negative than point G. Transistors $Q_9$ and $Q_{10}$ are both always conducting and function as emitter followers.

To again reiterate, circuit 20 of FIG. 2 is included in oscillator 10 and is necessary only when it is desired to vary timing current $I_2$ in order to control the period of oscillation. It is not necessary, nor is it desired, when control current $I_1$ is varied in order to control the period of oscillation.

Figure 3:
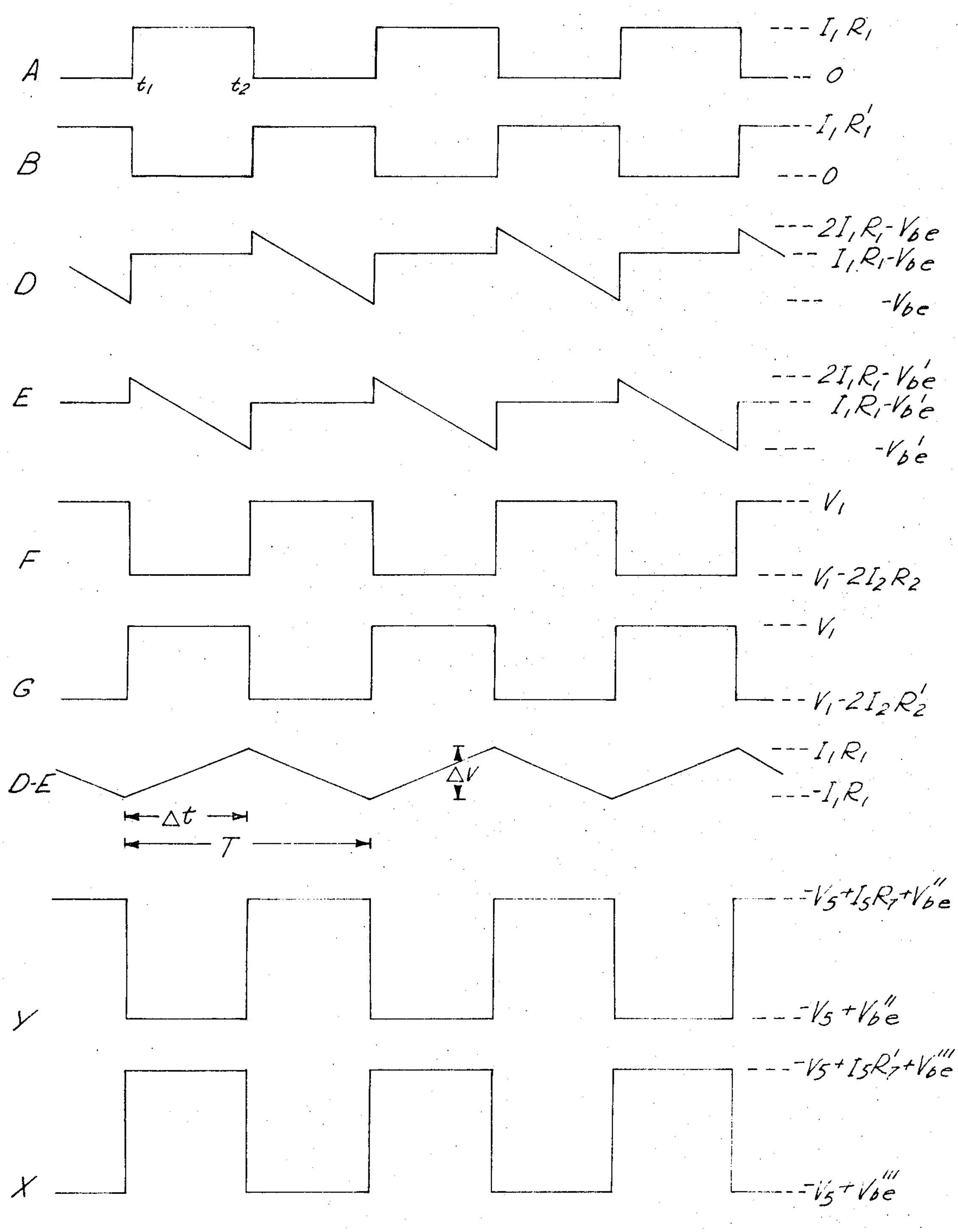
FIG. 3 is a graphical representation of the waveforms at various points in the circuits of FIGS. 1 and 2.

Assuming it is desired to vary the period by controlling current $I_2$, the new oscillator outputs at points X and Y are shown in FIG. 3. At time $t_1$, transistor $Q_1$ begins to conduct and transistor $Q_2$ becomes cut off. Therefore, the base electrode of transistor $Q_7$ is more negative than that of transistor $Q_8$; a constant current $I_5$ flows through transistor $Q_7$, and transistor $Q_8$ is cut off. The voltage at point H (base of $Q_9$) is $-V_5+I_5R_7$ and at point J is $-V_5$. Thus, the voltage at output X is $-V_5+I_5R_7+V_{be}''$ and the voltage at output Y is $-V_5+V_{be}'''$.

At time $t_2$, transistor $Q_1$ becomes cut off and transistor $Q_2$ begins to conduct. Therefore, the base electrode of transistor $Q_8$ is more negative than that of transistor $Q_7$, constant current $I_5$ flows through transistor $Q_8$, and transistor $Q_7$ is cut off. The voltage at point H is $-V_5$ and at point J is $-V_5+I_5R_7'$. Thus, the voltage at output X is $-V_5+V_{be}''$ and the voltage at output Y is $-V_5+I_5R_7+V_{be}'''$. It can be clearly seen that current $I_2$ is not present in the voltage expressions for waveforms X and Y. Thus, controlling the period of oscillator 10 by adjusting current $I_2$ does not affect the amplitude of the oscillator output signal at points X and Y when using isolation gate 20.

In sum, an important feature of the present invention is the ability to control the period of oscillation by controlling either an input control current ($I_1$) or a capacitor charging current ($I_2$) and to leave the amplitude of the oscillator output signal unaffected by such control.

Another important aspect of the present invention is the inherent self-compensation of he oscillator for temperature variations. The only temperature sensitive elements of the oscillator are the emitter-base junctions of transistors $Q_1$ and $Q_2$, the effects of which are cancelled due to the differential connection of these transistors. In other words, a change in temperature is directly manifested as an equal change in both base-emitter drops $V_{be}$ and $V_{be}'$ so no change in the period $\tau$ results. In contrast is the prior art which used a diode clamp as the control element. There the temperature coefficient of forward voltage characteristic of the diode enters into the output voltage expression.

The oscillator of the present invention can be used to advantage as the signal controlled oscillator of my referenced companion application Ser. No. 95,079. Current $I_0$ could be generated from the control signal output of the phase detector shown therein and the gross changes in frequency of the oscillator required by the changes in zones on the disc could be introduced by incremental changes in the current $I_2$ produced by constant current sources 12 and 14. As indicated above, isolation gate 20 would be employed to prevent variations in the oscillator output amplitude as the zones are changed.

Although the oscillator of the present invention has been described in regard to the specific elements and connections shown in the drawings, the invention, as embodied in the claims, is not to be so limited. For example, the oscillator period could be manually adjusted or fixed.

What is claimed is:

1. A signal-controlled oscillator for generating a periodic output signal, the period of which is a function of an adjustable input control signal, the oscillator comprising:

a. an adjustable input control signal source;

b. a multivibrator having a pair of alternately conducting switches and energy storage means that is connected to change its energy storage state in a direction depending upon the state of the pair of switches, that is, which of the pair of switches is conducting, each switch having an output terminal at which the oscillator output signal is generated and a control terminal;

c. means for alternately applying the input control signal to the control terminals of the switches in regenerative phase, depending upon which switch is conducting; and d. means for changing the state of the switches responsive to the energy storage state of the energy storage means and the magnitude of the input control signal.

2. The oscillator of claim 1, in which the applying means applies the input control signal to the control terminal of the switch that is conducting.

3. The oscillator of claim 2, in which the signal source is a constant current source.

4. The oscillator of claim 3, in which the switches each have an input terminal and a constant current charging source coupled to the input terminal of each switch to transmit a constant current to the output terminal of the conducting switch, the energy storage means comprising a capacitor connected between the input terminals of the switches.

5. The oscillator of claim 4, in which the control signal source is a phase detector, the oscillator output signal and a reference signal are applied to the phase detector, and the phase detector produces a signal representative of the phase difference between the oscillator output signal and the reference signal.

6. A current-controlled oscillator for generating a periodic output signal synchronized to a periodic reference signal, the oscillator comprising:

a. a multivibrator having alternately conducting switches, each switch having an output terminal at which the oscillator output signal is generated, an input terminal for receiving a bias current and transmitting the bias current to the output terminal when such switch is conducting, and a control terminal for receiving an input control current;

b. means for generating a control signal representative of the deviation of the oscillator output signal from synchronization with the reference signal;

c. means responsive to the signal levels at the output terminals of the alternately conducting switches for supplying the control signal to only one of the switches during a controlled time interval to develop a signal level at the control terminal thereof and then, after the controlled time interval, for supplying the control signal only to the other of the switches for the controlled time interval to develop a signal level at the control terminal thereof;

d. means responsive to the signal levels at the control terminals of the multivibrator switches for establishing the controlled time interval; and e. means for applying to each input terminal a bias current for transmission to the output terminal of the conducting switch.

7. The oscillator of claim 6, wherein the control signal is of the polarity to render the switch to which it is supplied conducting and the supplying means supplies the control signal to the switch that is conducting and then, after such switch cuts off, supplies the control signal to the other switch.

8. The oscillator of claim 6, wherein the generating means is a constant current source.

9. The oscillator of claim 6, wherein the controlled time interval establishing means includes a charge-discharge device coupling together the input terminals of the multivibrator switches.

10. The oscillator of claim 9, wherein the means for applying a bias current provides a constant charging current for transmission to the output terminal of the conducting switch and for the charge-discharge device.

11. The oscillator of claim 8, wherein the supplying means comprises a gate including first and second alternately conductive switches, each including an input terminal coupled to a constant current source, the first gate switch including the control terminal coupled to the output terminal of one multivibrator switch and an output terminal coupled to the control terminal of the one multivibrator switch, and the second gate switch including a control terminal coupled to the output terminal of the other multivibrator switch and an output terminal coupled to the control terminal of the other multivibrator switch.

12. The oscillator of claim 6, wherein the generating means is a phase detector to which the oscillator output signal and the reference signal are applied.

13. A signal controlled oscillator comprising:

a. a first transistor stage having an emitter, a base, and a collector;

b. a second transistor stage having an emitter, a base, and a collector;

c. a capacitor connected between the emitter of the first transistor stage and the emitter of the second transistor stage;

d. a first constant current source connected to the emitter of the first transistor stage to supply current in the direction of current flow therethrough;

e. a second constant current source connected to the emitter of the second transistor stage to supply current in the direction of current flow therethrough;

f. voltage bias means;

g. a first load resistor connecting the collector of the first transistor stage to the voltage bias means;

h. a second load resistor connecting the collector of the second transistor stage to the voltage bias means;

i. an adjustable control signal source, the amplitude of the control signal determining the period of the oscillator; and j. means for alternately applying to the base of one of the transistors a forward bias representative of the amplitude of the adjustable control signal, the forward bias being applied to the base of the other transistor stage when the one transistor stage becomes cut off.

14. The oscillator of claim 13, in which the means for applying a forward bias comprises third and fourth differentially connected transistor stages each having an emitter, a base, and a collector, the third and fourth transistor stages being of the opposite conductivity type from the first and second transistor stages, the base of the third transistor stage being connected to the collector of the first transistor stage, the base of the fourth transistor stage being connected to the collector of the second transistor stage, the collector of the third transistor stage being connected to the base of the first transistor stage, the collector of the fourth transistor stage being connected to the base of the second transistor stage, a third load resistor connected between the collector of the third transistor stage and a reference potential, a fourth load resistor connected between the collector of the fourth transistor stage and the reference potential, and means for coupling the control signal source to the emitters of the third and fourth transistor stages, one of the third and fourth transistor stages being cut off and the other conducting, depending upon which of the first and second transistor stages is conducting.

15. The oscillator of claim 14, in which the control signal source is a constant current source.

16. The oscillator of claim 15, in which the control signal source comprises a phase detector to which the oscillator output signal appearing at the collector of one of the first and second transistor stages and a reference signal are applied.

17. The oscillator of claim 13, in which the means for alternately applying a forward bias comprises a third resistor connected between the base of the first transistor and a reference potential, a fourth resistor connected between the base of the second transistor and a reference potential, and a switch alternately coupling the source to the third and fourth resistors in regenerative phase.

18. The oscillator of claim 17, in which the source is a constant current source.

* * * * *